United States Patent [19]

Chikamura et al.

[11] 4,236,829
[45] Dec. 2, 1980

[54] SOLID-STATE IMAGE SENSOR

[75] Inventors: Takao Chikamura, Osaka; Shinji Fujiwara, Minooshi; Yasuaki Terui, Neyagawa; Masakazu Fukai, Nishinomiya, all of Japan

[73] Assignee: Matsushita Electric Industrial Co., Ltd., Osaka, Japan

[21] Appl. No.: 6,129

[22] Filed: Jan. 24, 1979

[30] Foreign Application Priority Data

Jan. 31, 1978 [JP] Japan ................................. 53-10110
Feb. 1, 1978 [JP] Japan ................................. 53-10987
Jun. 19, 1978 [JP] Japan ................................. 53-74446

[51] Int. Cl.³ .................. H01L 29/161; H01L 27/14; H01L 29/78
[52] U.S. Cl. ....................................... 357/16; 357/30; 357/24; 357/31
[58] Field of Search ...................... 357/30, 31, 16, 24

[56] References Cited

U.S. PATENT DOCUMENTS

| 3,900,882 | 8/1975 | Fukai | 357/30 |
| 4,112,509 | 9/1978 | Wall | 365/189 |
| 4,148,048 | 4/1979 | Takemoto | 357/30 |
| 4,155,094 | 5/1979 | Ohba | 357/30 |

Primary Examiner—Martin H. Edlow
Attorney, Agent, or Firm—Burgess, Ryan and Wayne

[57] ABSTRACT

A solid-state image sensor is provided, which has a high spectral response over the whole visible light range and wherein a photoconductor layer having a hetero-junction defined by a hole blocking layer and a layer consisting of a system $(Zn_{1-x}Cd_xTe)_{1-y}(In_2Te_3)_y$ is formed over a semiconductor substrate which has charge transfer type unit cells or X-Y switching matrix type unit cells.

11 Claims, 12 Drawing Figures

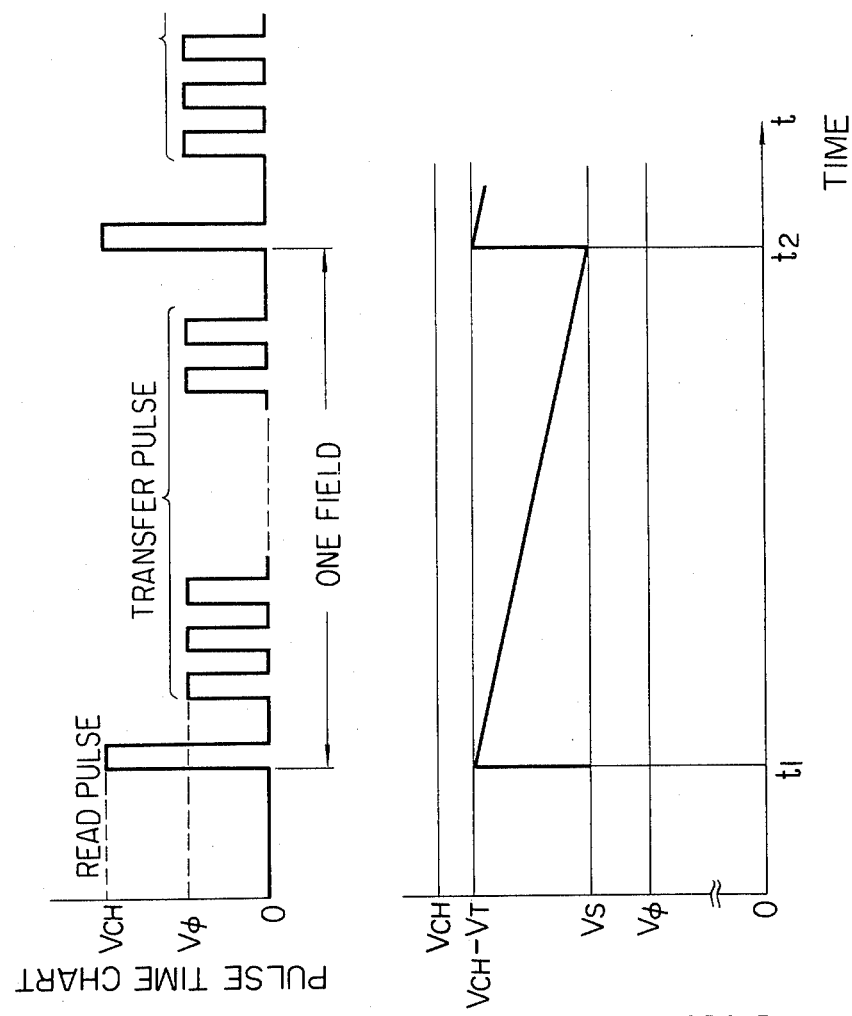

SOLID-STATE IMAGE SENSOR

BACKGROUND OF THE INVENTION

The present invention relates to a solid-state image sensor.

Much efforts have been made and are being made to develop the solid-state image sensors which are compact in size and light in weight and consume less power. The conventional solid-state image sensors may be classified into two types; that is, an X-Y switching matrix device and an charge transfer device. In the matrix type, photo-sensor unit cells such as diodes are arranged in the form of a matrix and are operatively connected to scanning circuits consisting of field-effect transistors. The charge transfer device may eliminate external scanning circuits such as those incorporated in the matrix device. The matrix device has a distinct disadvantage in that the light reception area of each unit cell is so small that the photoconductor conversion efficiency is very low. The charge transfer device is disadvantageous in that each unit cell has a dual function of detecting the incident light and transferring (to the output gate) a pack of electrons representative of the amount of incident light so that its signal-to-noise ratio (S/N ratio) is very low. Furthermore, because of absorption of the incident light by the electrode (which may, e.g., comprise polycrystalline silicon), the sensitivity to blue light is low.

In order to overcome the above problems, there have been devised and demonstrated various methods. For instance, a photoconductor layer is formed over the matrix type or charge transfer type unit cells. The characteristics such as spectral response and the dark current characteristic are dependent upon the properties of photoelectric films or layers. Therefore, the techniques enabling the formation of a photoelectric film or layer having excellent properties over a semiconductor substrate upon which are formed unit cells or circuit elements must be developed.

The inventors devised the photoconductor which has a hetero-junction between ZnSe and $Zn_{1-x}Cd_xTe$. This photoconductor has an excellent spectral response over the whole visible light range and exhibits very satisfactory desired other characteristic, so that its application to the target of an image pickup tube had been extensively studied and experimental work has been conducted on this subject. The image pickup tube incorporating this noble photoconductor is now known as "new vicon" which is a trademark of Matsushita Electric Industrial Co., Ltd. The light image is made incident on the ZnSe layer, so that a substrate made of a transparent glass and a transparent electrode mainly consisting of $SnO_2$ is formed under the ZnSe film or layer.

However, in the case of the solid-state image sensor of the type wherein the photoelectric film or layer is formed over a semiconductor or silicon substrate upon which are formed the charge transfer type or the matrix type unit cells as described above, the silicon substrate absorbs almost all of the visible light, so that the light image must be made incident on the film or layer of $Zn_{1-x}Cd_xTe$.

Alternatively, a film or layer of $(Zn_{1-x}Cd_xTe)_{1-y}(In_2Te_3)_y$ may be formed over a silicon substrate and a film or layer of ZnSE may be formed over the former film or layer. However, when this structure is subjected to a heat treatment in order to improve its photoconductive characteristics, a satisfactory stoichiometric composition of $(Zn_{1-x}Cd_xTe)_{1-y}(In_2Te_3)_y$ cannot be attained, resulting in the increase in dark current flowing across a junction. Thus, it is imperative to make the light image incident on the film or layer of $Zn_{1-x}Cd_xTe$. However, the response or sensitivity to the blue color of the prior art hetero-junction is so low when the light image is made incident on the film or layer of $Zn_{1-x}Cd_xTe$ that its application to a color image pickup tube or the like has been impossible.

In order to ensure satisfactory properties and characteristics of the photoelectric film or layer formed upon a semiconductive substrate, the photoelectric film or layer must form an ohmic contact with part of the semiconductor substrate and a transparent electrode formed over the photoelectric film or layer must not cause the degradation of desired properties and characteristics of the film or layer. In the hetero-junction of the type described above, a $SnO_2$ or $In_2O_3$ film or layer is formed as an electrode for the ZnSe layer, but the $SnO_2$ or $In_2O_3$ layer cannot attain a satisfactory ohmic contact with the silicon substrate. Thus, there had been a need for the development of a suitable electrode which may establish a satisfactory ohmic contact with the silicon and will not cause any degradation of desired properties and characteristics of the hetero-junction of the type described.

When the hetero-junction of the type described is used as a target of an image pickup tube, no electrode is needed on the side of the $Zn_{1-x}Cd_xTe$ film or layer because the electron beam functions as an electrode. However, in the case of applications of the hetero-junction of the type described above to other devices, an electrode must be formed over the film or layer of $Zn_{1-x}Cd_xTe$. Up to now silver paste had been used as an electrode, but it is not stable as an electrode and it is difficult to form an electrode in a desired shape with the silver paste. Furthermore, when the light image is made incident on the film or layer of $Zn_{1-x}Cd_xTe$, the transmission of the incident light through the silver paste electrode is so low that the applications of the hetero-junction of the type described had been very limited When the light image is made incident on the film or layer of $Zn_{1-x}Cd_xTe$ as in the case of the present invention, a second electrode which is formed over the hetero-junction must be transparent. However, up to now there had been no report at all concerning such a transparent second electrode. Various methods for forming transparent electrodes themselves had been devised and demonstrated. They are for instance (1) a spraying method; (2) CVD method; (3) an electron beam evaporation method; (4) a vacuum evaporation method; and (5) a sputtering method.

According to the spraying method, a film or layer of $SnO_2$ is formed over a substrate which is maintained at high temperature, by spraying an aqueous solution of $SnCl_4$. In the CVD method, a film or layer of $SnO_2$ is formed over a substrate, which is maintained at high temperature, by a chemical reaction between $O_2$ and $SnCl_4$ which is in a gas phase. In the case of the electron beam evaporation method, the electron beam is used to heat, melt and evaporate $SnO_2$ or $In_2O_3$ in an oxygen atmosphere at $10^{-3}$ to $10^{-4}$ Torr so as to deposit $SnO_2$ or $In_2O_3$ over a substrate. As in the case of the electron beam evaporation method, according to the vacuum evaporation method, In or Sn is heated, melted and evaporated in an oxygen atmosphere at $10^{-3}$ to $10^{-4}$ Torr so as to form a film or layer of $In_2O_3$ or $SnO_2$ over a substrate. According to the sputtering method, a target consisting of $In_2O_3$ or $SnO_2$ is sputtered in a vacuum of $10^{-2}$ to $10^{-4}$ Torr by the DC or AC glow discharges so as to form a transparent electrode layer of $In_2O_3$ or $SnO_2$.

These methods have their own advantages and disadvantages and are selected depending upon the desired properties and characteristics of a transparent electrode to be formed and upon the properties of a substrate upon which is formed a transparent electrode. For instance, in the cases of the method (1)–(4) set forth again, the substrate itself is responsible for the chemical reaction which results in the formation of a transparent electrode so that the substrate must be maintained at a temperature higher than 200° C. In the case of the method (5) or the sputtering method, a transparent electrode may be formed even when a substrate is maintained at low temperatures, but because of the impingement of ions against the substrate, surface damages result very often.

SUMMARY OF THE INVENTION

Accordingly, one of the objects of the present invention is to provide a solid-state image sensor which may be made compact in size and light in weight, may exhibit an extremely high spectral response or sensitivity and an extremely high S/N ratio.

Such a solid-state image sensor as described above may be provided by forming a hetero-junction defined by a hole blocking layer and a layer of a system of $(Zn_{1-x}Cd_xTe)_{1-y}(In_2Te_3)_y$ over a semiconductor substrate having thereon a charge transfer circuit such as a Bucket Brigade Device or a charge-coupled device or an X-Y switching matrix device consisting of a combination of photodiodes and MOS electric-field transistors.

According to the present invention, in order to improve the spectral response especially to the blue light, the concentration of CdTe is gradually increased as the depth (which is measured from the surface upon which the light is incident) increases. Furthermore, in order to minimize the dark current to a minimum and to attain a high S/N ratio, the hole blocking layer is made of ZnO, ZnS, ZnSe, CdS or CdSe; an electrode interposed between the hole blocking layer and a semiconductor substrate is made of Mo, Ta or Ti; and a transparent electrode which is formed over a layer of $(Zn_{1-x}Cd_xTe)_{1-y}(In_2Te_3)_y$ consists of a material such as a compound which contains $SnO_2$, $In_2O_3$, Au or Pt and whose work function is in excess of 4.5 eV. The transparent second electrode is formed by a sputtering method and the thus formed electrode is subjected to a after-heat treatment in order to improve its photoelectric characteristics.

BRIEF DESCRIPTION OF THE DRAWINGS

FIGS. 2A and 2B show the waveforms of pulses and a diode voltage used for the explanation of the mode of operation of the unit cell shown in FIG. 1;

DESCRIPTION OF THE PREFERRED EMBODIMENTS

First Embodiment

Figure 1:
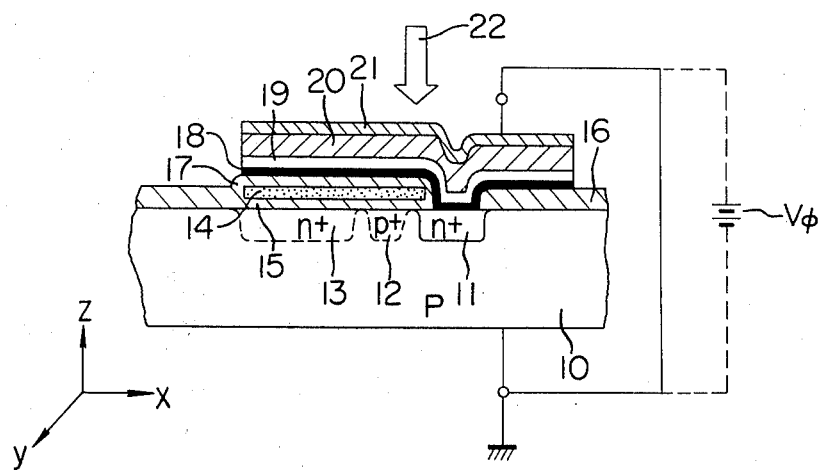
FIG. 1 is a schematic sectional view of an embodiment of a unit cell of a charge transfer type solid-state image sensor in accordance with the present invention.

FIG. 1 is a schematic sectional view of a unit cell of a solid-state image sensor comprising a charge transfer type circuit element fabricated on a silicon (Si) substrate. A diode is fabricated by forming an $n^+$ type region 11 in a p-type Si substrate 10. A potential barrier 12 serves to interrupt the injection of electrons from the $n^+$ type region 11 in the case of the operation as a charge-coupled device (to be referred to as "CCD" hereinafter in this specification) and is the $p^+$ region. An $n^+$ type region 13 serves as a potential well in the case of the operation as a Bucket Brigade Device (to be referred to as "BBD" hereinafter in this specification). Depending upon whether the unit cell is operated as a CCD or BBD, the region 12 or 13 is formed.

Since the operation of both the CCD and BBD is fundamentally based upon the charge transfer, the unit cell will be described as BBD having the regions 13 and 11 which are the $n^+$ type.

A first gate electrode 14 has a portion overlapping the $n^+$ type region 11. An insulating film 15 is interposed between the Si substrate 10 and the first gate electrode 14. In like manner, an insulating film 16 is interposed between a first electrode 18 and the substrate 10 while an insulating film 17 is also interposed between the first gate electrode 14 and the first electrode 18. The first electrode 18 is electrically connected to the $n^+$ type region 11 and to a hole blocking layer 19. A second electrode 21 is formed over a photoelectric film 20 consisting of $(Zn_{1-x}Cd_xTe)_{1-y}(In_2Te_3)_y$ and is maintained at the same potential as the substrate 10. The light 22 is incident upon the second electrode 21. As indicated by the broken line, a voltage $V\phi$ may be applied to the second electrode 21. In this case, the voltage applied across the hetero-junction between the hole stopper layer 19 and the photoelectric layer 20 may be varied.

Next, the optical information read-in operation of the unit cell with the above construction will be described with further reference to FIG. 2A showing the driving pulses as well as to FIG. 2B showing the variations in potential at the first electrode 18. When a read-in pulse $V_{CH}$ is applied to the first gate electrode 18 at $t_1$, the potential at the first electrode 18 rises to $(V_{CH}-V_T)$ as shown in FIG. 2B, where $V_T$ represents the threshold voltage of a field-effect transistor constituted of the n+ type regions 11 and 13 and the first gate electrode 14. When the light 22 is incident upon the second electrode 21, the electron-hole pairs are generated in the photoelectric layer 20; and the electrons from said pairs reach the first electrode 18 while the holes from said pairs reach the second electrode 21. Thus the potential at the first electrode 18 drops, in proportion to the amount of incident light toward Vs during a time interval of one field. When $V_{CH}$ is applied to the first gate electrode 14 at $t_2$, the surface potential of the semiconductor under the first gate electrode 14 rises, so that the electrons inject from the n+ type region 11 into the n+ type region 13 and are transferred through the insulating film or the gate oxide film 15 into a coupling capacitor $C_B$ defined between the substrate 10 and the first gate electrode 14. As a result, the potential in the n+ type region 11 rises again to $(V_{CH}-V_T)$, so that the electron injection is stopped. Therefore, the electron injection is stopped when a pack of electrons equivalent to that lost in discharge has moved into the coupling capacitor $C_B$, so that the total quantity of electrons injected into the coupling capacitor $C_B$ is proportional to the amount of incident light.

When the second electrode 21 is biased to $V\phi$ as indicated by the dotted lines in FIG. 1, the potential of the diode will not drop below $V\phi$ even when the light 22 is incident in a large amount, so that "blooming" may be avoided.

Figure 3:
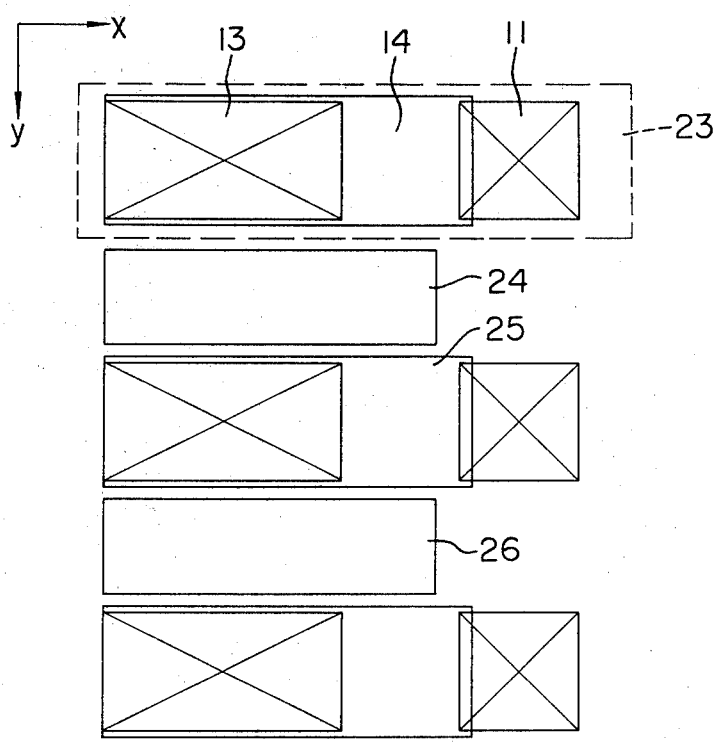
FIG. 3 is a top view of the unit cells of the type shown in FIG. 1, which are arranged in the form of the charge transfer type.

Next referring to FIG. 3, the means for delivering to the output the read-in photoelectric signal by the charge transfer will be described. In FIG. 3, the solid-state unit cell shown in FIG. 1 is arranged as a linear sensor and is indicated by the reference numeral 23 within the dotted lines. Second electrode 24 and 26 are additionally interposed between the first gate electrodes 14 and 25 of the adjacent unit cells. The pack of charge injected in a fashion described above into the n+ type region 13 moves immediately below the second gate electrode 24 in the charge transfer manner as a positive transfer pulse as shown in FIG. 2A this is applied to the second gate electrode 24. The pack of charge moved below the second electrode 24 is then moved to the first gate electrode 25, and then the pack of charge moved immediately below the first gate electrode 25 is moved below the second gate electrode 26 in a manner substantially similar to that described above. Thus, the pack of charge is sequentially moved through transfer electrodes to the output diode. That is, the incident light is converted into the signal electrons which in turn are transferred to the output gate.

Second Embodiment

Figure 4:
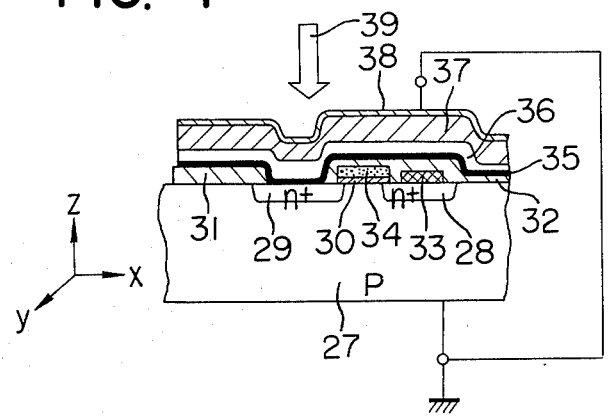
FIG. 4 is a schematic sectional view of a unit cell of an X-Y switching matrix type solid-state image sensor in accordance with the present invention.

FIG. 4 shows a second embodiment of the present invention; that is, one of the photosensor unit cells in a X-Y switching matrix device on a silicon (Si) chip. "n+ type" regions 28 and 29 are formed in a p-type silicon substrate 27, and a gate electrode 34 is separated through an insulating layer 30 from the substrate 27. The n+ type regions 28 and 29 and the gate electrode 34 form a field-effect transistor. The n+ type region 28 serves as a drain and is connected to an electrode 33 which in turn is connected to a row selection line. The gate electrode 34 is connected to the corresponding electrode of an adjacent field-effect transistor and serves as a column selection line. The n+ type region 29 serves as a source. The unit cell further includes insulating layers 31 and 32 over which is formed a first electrode 35. The first electrode 35 is electrically connected to the source 29. A hole blocking layer 36 is formed over the first electrode 35, and a photoconductor film 37 consisting of $(Zn_{1-x}Cd_xTe)_{1-y}(In_2Te_3)_y$ is formed over the hole blocking layer 36. A second electrode 38 is formed over the photoconductor film 37 and is maintained at the same potential as the substrate 27. As in the case of the first embodiment, the second electrode 28 may be biased with a suitable voltage. The light 39 is incident on the second electrode 38.

Figure 5:
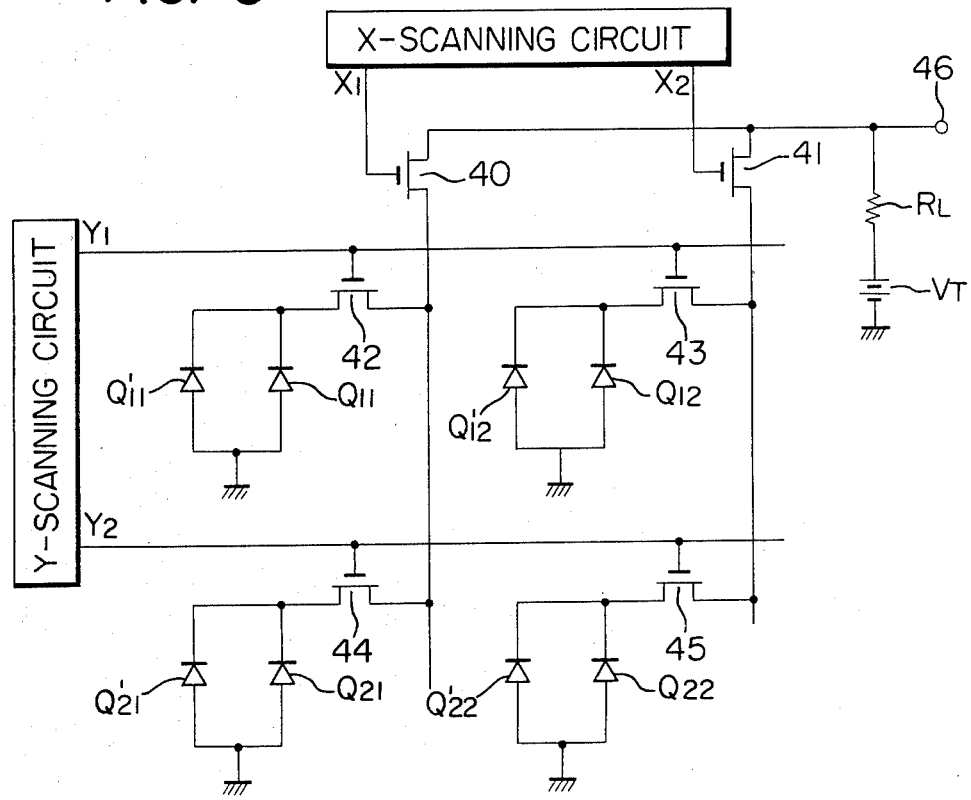
FIG. 5 is a circuit diagram of an X-Y switching matrix type image sensor incorporating the unit cells of the type shown in FIG. 4.

Next referring further to FIGS. 5 and 6, the read-in operation will be described. FIG. 5 shows four unit cells of the type shown in FIG. 4, which are arranged into an array mosaic consisting of two rows and two columns. The area or two dimensional image sensor further includes field-effect transistors 40–45, X- and Y-direction scanning circuits with scanning lines $X_1$, $X_2$, Y, and $Y_2$ and an output terminal 46.

Figure 6:
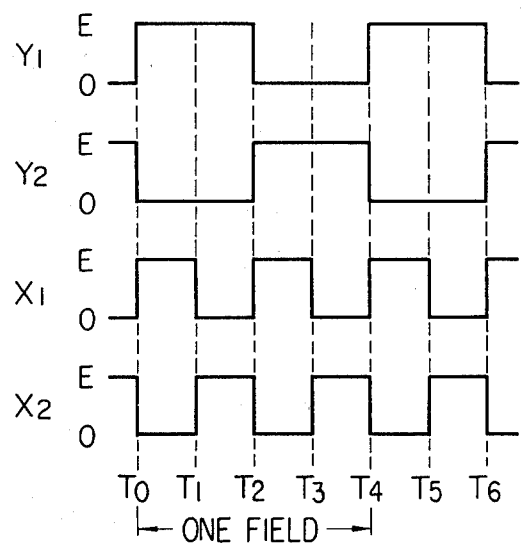
FIG. 6 is a timing diagram of pulses used to drive the image sensor shown in FIG. 5.

FIG. 6 shows the waveforms of pulses applied to the scanning lines $Y_1$-$X_2$ from the Y- and X-direction scanning circuits. When the pulse as shown in FIG. 6 is applied to the line $Y_1$ at $T_0$, the field-effect transistors 42 and 43 are turned on. Since the pulse is also applied to the line $X_1$, the field-effect transistor 40 is also turned on so that the current flows from a power supply $V_T$ through a load resistor $R_L$ to the diodes $Q_{11}$ and $Q'_{11}$ to bias reverse them. The diode $Q_{11}$ is constituted of the source 29 and the substrate 27 while the diode $Q'_{11}$, is constituted of the hole stopper layer 36 and the photoconductor layer 37.

At $T_1$, the field-effect transistor 40 is turned off while the field-effect transistor 41 is turned on so that from $T_1$ to $T_2$ the diodes $Q_{12}$ and $Q'_{12}$ are reverse biased. In like manner, the diodes $Q_{21}$ and $Q'_{21}{}^2$ are reverse biased from $T_2$ to $T_3$ and the diodes $Q_{22}$ and $Q'_{22}$, from $T_3$ to $T_4$.

When the light is incident upon the diode $Q'_{11}$, the cathode potentials of the diodes $Q'_{11}$ and $Q_{11}$ drop from a biased potential from $T_0$ to $T_1$ in proportion to the amount of incident light. The drop is stored for a time interval of one field (one field repetition cycle). From $T_4$ to $T_5$, the field-effect transistors 40 and 42 are turned on as in the case of the time interval from $T_0$ to $T_1$ so that a pack of charge which is the same in quantity to that lost in proportion to the amount of incident light, is supplied from the power supply $V_T$ through the load resistor $R_L$. As a result, the potential at the output terminal 46 changes in proportion to the amount of incident light. In like manner, as the pulses are sequentially applied, the outputs representative of the amounts of light incident upon the diodes $Q'_{12}$ and $Q_{12}$; $Q'_{21}$ and $Q_{21}$; and $Q'_{22}$ and $Q_{22}$, may be delivered time-serially.

Manufacturing Method

Next, the method of fabricating the solid-state image sensors in accordance with the present invention will be described.

Referring back to FIG. 1, the n+ type regions 11 and 13 are formed in the p-type silicon wafer by a diffusion method and thereafter, the gate oxide film 15 is formed by a thermal oxidation method. The polycrystalline silicon is then deposited over the gate oxide film 15 so as to form the gate electrode 14. Thereafter, by a CVD-$SiO_2$ or thermal oxidation method, the insulating films 16 and 17 are formed. When CVD-$SiO_2$ contains a compound such as $P_2O_5$ having a low melting point, the fluidization of the insulating films 16 and 17 occurs at such a low temperature as 1100° C. so that the steps resulting from the formation of the gate electrode 14 may be flattened to some extent. Thereafter, a contact window is formed which reaches the region 11. Next the first electrode 18 consisting of molybdenum, tantalum or titanium is formed to a thickness of 0.05 to 0.5 microns by a sputtering or electron beam deposition method while the wafer is maintained at a temperature from 20° to 400° C. Thus, a substrate for a charge transfer device is prepared.

A substrate for a X-Y matrix type image sensor may be prepared in a manner substantially similar to that described above. Referring back to FIG. 4, the n+ type regions 28 and 29 are formed by a diffusion method; the gate oxide film 30 is formed by a thermal oxidation method; the gate electrode 34 is formed by the deposition of the polycrystalline silicon; the insulating layers 31 and 32 are formed by a $CVD-SiO_2$ method; the row selection line 33 is formed by the deposition of the polycrystalline silicon or molybdenum; and the first electrode is formed by the deposition of molybdenum, tantalum or titanium.

Next, the formation of the photoelectric layer or film will be described. Since the same photoconductive layer may be used in either the charge transfer device of the type shown in FIG. 3 or the X-Y switching matrix device shown in FIG. 5, the formation of this film or layer will be described with reference to the unit cell shown in FIG. 1.

The substrate prepared in the manner described above is maintained at a temperature between 150° and 300° C. and the hole blocking layer 19 is formed to a thickness of 0.05 to 1.0 micron by a vacuum evaporation method with ZnO, ZnS, ZnSe, CdS or CdSe. Thereafter, while the substrate is maintained at a temperature between 100° and 350° C., $(Zn_{0.7}Cd_{0.3}Te)_{0.95}$ $(In_2Te_3)_{0.05}$ is deposited to a thickness of 0.5 to 4.0 microns by a vacuum evaporation method so as to form the photoelectric layer 20. Alternatively, the photoelectric layer 20 may be formed by first depositing a compound mainly consisting of CdTe to a thickness of 0.3 to 3.0 microns under the same conditions as described above and then depositing $(ZnTe)_{0.99}$ $(In_2Te_3)_{0.01}$ to a thickness of 0.2 to 2.0 microns. Thus, there is provided a hetero-junction which is subjected to the heat treatment in a vacuum at 300° to 600° C. for 3 to 60 minutes. As a result, the photoelectric layer 20 with a desired quality may be provided.

The second electrode 21 is formed over the photoelectric layer 20 by the deposition of Au or Pt by an electron beam evaporation method or vacuum evaporation method while the substrate is maintained at 20° to 100° C. Alternatively, the second electrode 21 may be formed by the sputtering of $InO_3$ or SnO. That is, a sputtering apparatus is evacuated to $10^{-5}$ to $10^{-6}$ Torr and an argon-oxygen gas mixture containing the oxygen at a partial pressure of 3 to 10% is charged into the apparatus until the pressure rises to $10^{-2}$ to $10^{-4}$ Torr. Then, the sputtering operation is started. It is preferable to use as a target a compound such as $(In_2O_3)_{0.9}$ $(SnO_2)_{0.1}$ or $SnO_2$ containing a few percent of $Sb_2O_3$. The higher the sputtering power, the higher the sputtering efficiency becomes, but the surface damages are increased accordingly. Therefore, in general, the transparent electrode of a thickness of 0.1 to 1.0 microns is formed by the sputtering at 40 to 300 Watts for five to 30 minutes. When surface damages are excessive, the transparent electrode may be subjected to an after-heat treatment for 5 to 60 minutes at 100° to 200° C. in the air or in a vacuum. By this heat treatment, there may be provided a photoelectric layer which is extremely sensitive and has less dark current.

In summary, the solid-state image sensors which are extremely sensitive and have a high S/N ratio may be provided.

Next, the important effects, features and advantages of the present invention which will be very helpful in understanding the appended claims will be described in detail hereinbelow.

Figure 7A:
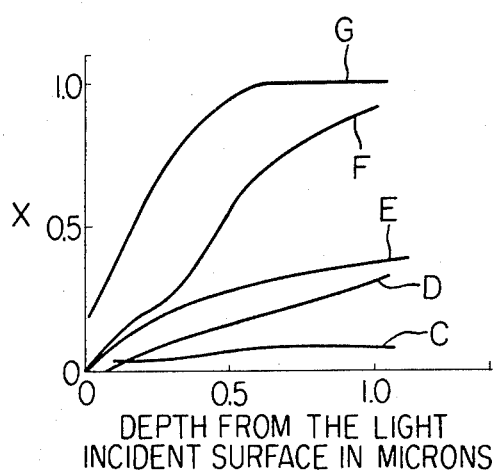
FIG. 7A shows the relation between the composition distribution in terms of x of a system $(Zn_{1-x}Cd_xTe)_{1-y}(In_2Te_3)_y$ and the depth from the surface thereof upon which the light is made incident.

First, the relationship between the distribution of the composition in the direction of the thickness of the films and the spectral sensitivity will be described. FIG. 7A shows the relation between the film thickness in $\mu m$ and the distribution in terms of x of the composition in the direction perpendicular to the substrate. The distributions were obtained by analyses based on the Auger effect of five specimens C, D, E, F and G in which the content of CdTe was increased in the order named. It is seen that the slopes of the characteristic curves C to G increase as the content of CdTe increases.

Figure 7B:
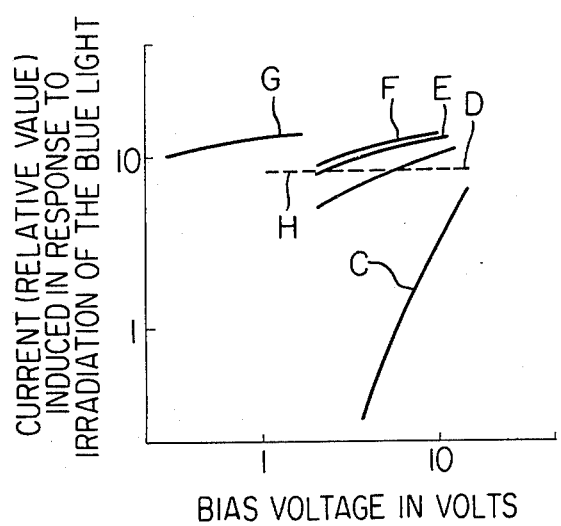
FIG. 7B shows the relationship between the voltage applied to and the response to the blue light.

FIG. 7B shows the relation between the voltages in volts and the sensitivity in terms of current to the blue light. It is also seen that in general, as the content of CdTe increases, the sensitvity also increases. The dotted line characteristic curve H indicates the sensitivity of a typical silicon photodiode. In case of the specimen C, the higher the voltage, the higher the sensitivity becomes and also the higher the dark current becomes. As a result, the specimen C is not preferable in practice in view of S/N ratio.

The blue light has a higher absorption coefficient and the specimens E and F are similar in composition distribution to the thickness of about 0.3 microns, but are considerably different when the film thickness exceeds about 0.3 microns as shown in FIG. 7A. From FIG. 7B it is also seen that the specimens E and F exhibit a similar sensitivity to the blue light. From the foregoing facts, it may be concluded that the sensitivity of the photoconductor is mainly governed by the composition distribution thereof within the first 0.3 microns of depth of the photoconductive layer.

From FIG. 7B, it is seen that the specimen D exhibits a sensitivity higher than the silicon photodiode. Therefore, the solid-state image sensor, in accordance with the present invention, must exhibit a sensitivity at least equal to or higher than the specimen D. From FIG. 7A it is seen that the average composition in terms of x of the specimen D is 0.05 when the film thickness is less than 0.3 microns and that the closer to the second electrode 21, the less the value x becomes. Thus, the structure of the solid-state image sensor in accordance with the present invention must be such that the average composition $[(Zn_{1-z}Cd_xTe)_{1-y}(In_2Te_3)y]$ to a thickness of 0.3 microns must be higher than 0.05 in terms of x and that the closer the corresponding part of the composition to the second electrode, the lower the value of x must be. Then, the surface conduction band is inclined so that the recombination of optically excited electrons and holes becomes difficult and consequently, the sensitivity to the blue light may be improved. When x is equal to 1, the conduction band has no inclination so that the sensitivity to the blue light becomes lower than when x is more than or equal to 0.05 and an increase in dark current results. Therefore, the condition of x is equal to 1 is eliminated. However, in the case of a solid-state image sensor for picking up a black-and-white image, the composition $(Zn_{1-x}Cd_xTe)_{1-y}(In_2Te_3)_y$ may be satisfactorily used under the conditions $0 < x < 1$ and $0 < y \leq 0.3$ because it may exhibit a sufficient sensitivity to the white light and the dark current is less.

TABLE 1 shows the properties of the photoelectric films of the present invention and the prior art.

TABLE 1

| Photo-conductor | Response to Blue Light ($\mu A/\mu W$)*1 | Dark Current ($DA/cm^2$)*2 | Total Response ($\mu A/lm$) | Direction of Incident Light |
|---|---|---|---|---|
| $Sb_2S_3$ | 0.07 | 20 | 300 | To Substrate |
| Si Photodiode | 0.12 | 10 | 4500 | To Upper Electrode |
| New Vicon | 0.045 *3 | 5 | 4000 | To Upper Electrode |
| The Invention | 0.25 | 5 | 4500 | To Upper Electrode |

*1 Measured at an optimum voltage and at a wavelength of 400 microns and over a same area.
*2 Measured at an optimum voltage.
*3 When the light is incident on a substrate, the response is 0.27.

Figure 8:
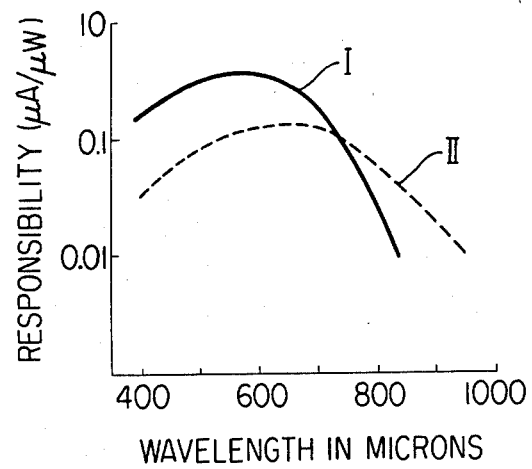
FIG. 8 shows a spectral response of a solid-state image sensor of the present invention in comparison with that of a prior art device.

It is apparent that the photoelectric film of the present invention exhibits a sensitivity to the blue light higher than those of the prior art and that the former is substantially similar in dark current as well as the sensitivity to the white light to the new vicon. The data shown in TABLE 1 were obtained from the measurements over the same surface areas of the specimens. In this connection, it must be emphasized that according to the present invention, the photoelectric film may be formed even over the gate electrode 14 in FIG. 1 or 24 in FIG. 3 in case of the charge transfer type device and even over the gate electrode and/or insulating layers 34, 31 and 32 in FIG. 4 in the case of the X-Y switching matrix type device, so that the light reception efficiency in terms of the surface area of the photoelectric layer, may be remarkably increased by as much as 4 to 10 times as compared with the prior art solid-state image sensors, and the like. As a result, the solid-state image sensor having an extremely higher degree of sensitivity may be provided as shown in FIG. 8, in which the spectral sensitivity characteristic curve I of the solid-state image sensor in accordance with the present invention is shown in comparison with that of curve II illustrating the prior art device. It is readily seen that the solid-state image sensor of the present invention exhibits an excellent spectral response in the visible light range which is less than 700 microns.

Figure 9:
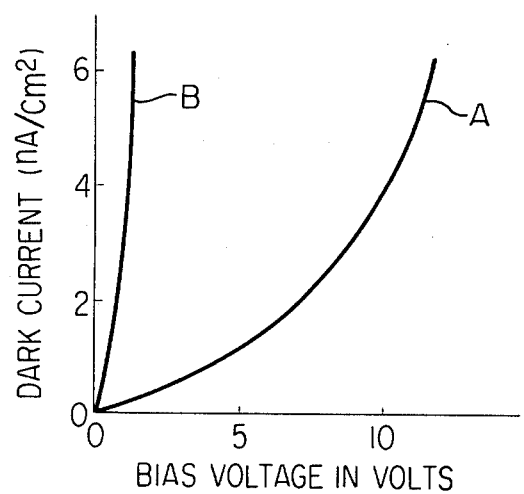
FIG. 9 is a graph showing the difference in dark current flowing across a hetero-junction between a structure having a hole blocking layer in accordance with the present invention and a structure not provided with such hole blocking layer.

Next, the function of the hole blocking layer 19 will be described in detail. The hole blocking layer 19 is made of ZnO, ZnS, ZnSe, CdS or CdSe. From FIG. 9, it is readily seen that the presence of the hole blocking layer 19 may be considerably effective in suppressing the dark current. That is, the curve A shows the dark current when the hole blocking layer is formed as compared to the dark current characteristic curve B, when no hole blocking layer is formed. The degree of dark current suppression by the hole blocking layer 19 is dependent on the materials used and the operating conditions. For instance, when the hole blocking layer 19 is made of ZnS, it exhibits a high resistance so that it operates on a high voltage. As a result, it is preferable to reduce the thickness of the ZnS hole blocking layer as practically as possible for instance, to 0.1 $\mu m$. When the hole blocking layer is composed of ZnSe, because of moderate resistance, the optimum thickness is about from 0.1 to 0.5 $\mu m$. The fundamental function of the hole blocking layer 19 is to prevent the injection of holes from the first electrode, thereby suppressing the flow of dark current. Therefore, it is to be understood that the materials of the hole blocking layer 19 are not limited to those described above.

Next, the first electrode 18 whose material greatly affects the performance of the solid-state image sensor of the present invention, will be described in detail. In general, the first electrode 18 has an important dual function of (a) forming an ohmic contact with the silicon and (b) preventing the degradation of properties of the hetero-junction between the hole blocking layer 19 and the photoconductor layer 20 consisting of $(Zn_{1-x}Cd_xTe)_{1-y}(In_2Te_3)_y$. The degradation may be attributed to the difference in coefficient of thermal expansion between the first electrode 18 and the hetero-junction which in turn is caused by the heat treatment following the vacuum evaporation step. The degradation of the hetero-junction is also caused from by the thermal diffusion of the first electrode material into hetero-junction.

TABLE 2 shows (a) the dark current in nA and (b) the condition of the ohmic contact with silicon when the first electrode 18 is made of various materials listed.

TABLE 2

| Characteristics | Material | | | | | | | | | |
|---|---|---|---|---|---|---|---|---|---|---|
| | Mo | Ta | Ti | Ni | Cr | W | Al | Poly-Si | $Sn O_2$ | $In_2 O_3$ |
| Dark Current (nA) | 5 | 7 | 9 | 700 | 700 | 70 | — | — | 7 | 20 |
| Evaluation of ohmic Contact with Silicon | O | O | O | O | O | O | O | O | X | X |
| Remarks | | | | | | | Grain Growth | Separation | | |

O = Satisfactory
X = Unsatisfactory

It is seen that when the first electrode is made of Mo, Ta or Ti, less dark current flows, but when the electrode is made of the other materials, dark current considerably increases. When the electrode is made of polycrystalline silicone or aluminum (Al), no dark current is given. The reason is that in the case of the polycrystalline silicon electrode, the separation between the first electrode and the hetero-junction occurs, and in the case of the aluminum electrode, the breakage of the hetero-junction results due to the grain growth of Al during the heat treatment step. Except for these two cases, the diffusion of the material of the first electrode into the hetero-junction during the heat treatment step may be responsible to the increase in dark current. In the case of solid-state image sensor, dark current causes noise component and, as described elsewhere, excessive dark current causes the failure of the correct storage of photocurrent. Thus, the less the dark current flows, the better the performance of the solid-state image sensors becomes. The use of $SnO_2$ or $In_2O_3$ results in less dark current, but a satisfactory ohmic contact with the silicon cannot be attained. Therefore these materials cannot be used in the present invention. Thus, it is preferable that the main constituent of the first electrode 18 is Mo, Ta or Ti.

Next, the second electrode will be described in detail. The flow of dark current across the hetero-junction is greatly dependent upon the work function of the material of the second electrode 21 as shown in TABLE 3.

TABLE 3

| Char- | Material | | | | | | | |
|---|---|---|---|---|---|---|---|---|
| acteristics | In | Al | Ag | Cu | Au | $In_2O_3$ | $SnO_3$ | Pt |
| Dark Current in nA when biased to 5V ($nA/cm^2$) | 500 | 150 | 200 | 100 | 5 | 5 | 5 | 8 |
| Work Function in eV | 40 | 3.74 | 4.28 | 4.47 | 4.58 | 4.8 | 5.2 | 5.2 |

When the material of the second electrode 21 has a work function less than about 4.5 eV, the second electrode will not function as a barrier against electrons so that a rapid increase in dark current results. Therefore, the present invention requires that the work function of the material for the second electrode must be higher than 4.5 eV. The materials selected by the present invention for the second electrode 21 may be deposited by a vacuum evaporation method or a sputtering method in a stable state so that the separation or breakage of the second electrode such as Ag paste may be avoided.

Next, the difference of the hetero-junction characteristics between the transparent electrodes formed by various processes and the effects attained by the heat treatment after the formation of the transparent electrode will be described in detail.

First, the flow of dark current across the hetero-junction is considerably different depending upon a process employed for forming a transparent electrode as shown in TABLE 4.

TABLE 4

| | Material | | | | |
|---|---|---|---|---|---|
| Char-acteristics | Spray-ing | CVD | Electron Beam Evapor-ation | Vacuum Evapor-ation | Sput-tering |
| Dark Current ($nA/cm^2$) with bias Voltage of 5 V | more than 1000 | more than 1000 | more than 500 | more than 500 | about 5 |

Both the spraying and CVD methods have been described elsewhere. The substrate or wafer is maintained at 500° C. and 300° C., respectively.

In the case of the electron beam evaporation method, $(In_2O_3)_{0.8}(SnO_2)_{0.2}$ was evaporated and deposited in the oxygen atmosphere at a pressure of the order of about $10^{-4}$ Torr. In this case, when the temperature of the substrate drops below 150° C., the transparency of the resultant transparent electrode decreases while the resistivity increases. On the other hand, when the temperature exceeds 150° C., the transparency may be improved, but the dark current flowing across the hetero-junction increases.

The results from the vacuum evaporation method were similar to those attained by the electron beam evaporation method.

In case of the sputtering, which has been described elsewhere, in order to minimize the surface damages of the transparent electrode, the electrode is initially formed to a thickness of hundreds angstroms (Å) with a relatively low power in the order of, for instance, from 30 to 50 watts and then with an increased power in the order of, for instance, 150 watts. Then, the transparent electrode has a low and stabilized resistance and a low dark current. From the above description and the data shown in TABLE 4, it is most advantageous to use a sputtering process for the fabrication of the second electrode 21 which must be transparent.

As described elsewhere, when a high power is used in a sputtering process for forming the second transparent electrode, surface damages tend to be pronounced. However, according to the present invention, these surface damages and consequently resultant degradation of desired properties may be substantially eliminated as will be described in detail below.

Figure 10:
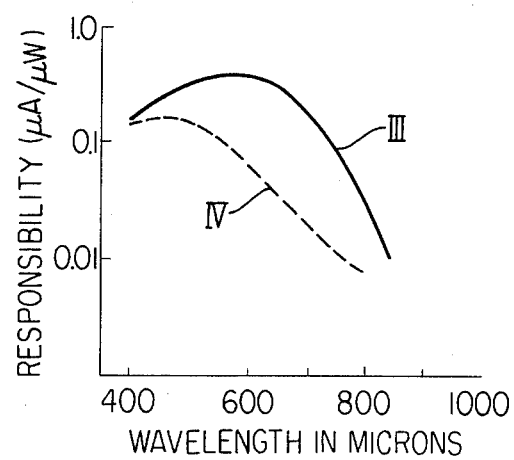
FIG. 10 is a graph used for the explanation of the advantages attained by the after-heat treatment after a transparent second electrode has been formed.

The advantages of the after-heat treatment which is carried out in accordance with the present invention are obvious from the data shown in FIG. 10 and TABLE 5. In FIG. 10, the solid-state sensor unit cell which is not subjected to the after-heat treatment exhibits the spectral response curve IV. The transparent electrode was formed to a thickness of 0.2 microns by a sputtering method at about 200 watts. On the other hand, when the unit cell is subjected to the after-heat treatment for 30 minutes at 150° C. in order to recover its surface damages, its spectral response may be considerably improved as indicated by the curve III in FIG. 10. Furthermore, the dark current characteristic as well as the photoconductive response may be remarkably improved as shown in TABLE 5.

TABLE 5

| | Prior to Heat Treatment | After-Heat Treatment |
|---|---|---|
| Dark Current when Biased to 5 V | $20nA/cm^2$ | $5nA/cm^2$ |
| Spectral Response in $\mu A/lm$ | 1500 | 4500 |

The after-heat treatment conditions must be adjusted depending upon the power used in the sputtering process. As described above, the higher the sputtering power, the more the surface damages are pronounced, so that a heat treatment temperature must be raised or a heat treatment time nust be increased.

APPLICATIONS

As described above, according to the present invention, the electron transfer type unit cells are formed on a substrate or an X-Y switching matrix type of unit cells are formed on a substrate, and the hetero-junctions are formed over the unit cells. The hetero-junctions of the present invention insure a high sensitivity hitherto unattainable by any prior art methods and suppress dark current to a minimum. Thus, the solid-state image sensor having an extremely high signal-to-noise ratio and an extremely high sensitivity or spectral response is provided. The present invention provides both a linear type and an area type solid-state image sensor. As is well known in the art, the linear type or one-dimensional solid-state image sensor is used advantageously as a sensor in a facsimile system. Because of the extremely high sensitivity, the lighting conditions are considerably relaxed so that a long service life of a light source is insured. In the case of the two-dimensional or X-Y switching matrix device, the images are satisfactorily picked up even under poor or low lighting conditions. Furthermore, because of its extremely high sensitivity, it is by far very advantageous to be incorporated into a colour television camera so that the light level is reduced. In addition to above, the solid-state colour image sensors in accordance with the present invention find a wide variety of applications in many fields.

What is claimed is:

1. A solid-state image sensor, comprising:
   a semiconductor substrate having a region of a first conductivity type and one or more regions of a second opposite conductivity type, said regions extending to a major surface of said substrate;
   an insulating layer formed over said major surface of said semiconductor substrate leaving exposed one portion of said region of said second conductivity type;
   a first electrode disposed on said insulating layer and extending to overlie and make electrical contact with said region of said second conductivity type;
   an n-type semiconductor layer overlying said insulating layer and overlying and in electrical contact with said first electrode;
   a film disposed on said n-type semiconductor layer so as to form a heterojunction therewith and comprising $(Zn_{1-x}Cd_xTe)_{1-y}(In_2Te_3)_y$, where $0<x<1$ and $0<y<0.3$;
   a second electrode formed on said $(Zn_{1-x}Cd_xTe)_{1-y}(In_2Te_3)_y$ film and electrically connected to said semiconductor substrate;
   a charge transfer or switching element formed in one portion of said semiconductor substrate separate from and adjacent to said region of said second conductivity type, and
   a gate electrode for entering the charge stored in said region of said second conductivity type into said charge transfer or switching element.

2. A solid-state image sensor as defined in claim 1, wherein the average composition of said film to a depth of 0.3 microns measured from the second electrode is $1.0>x>0.05$, the value of x increasing, as the depth of said film from said second electrode increases.

3. A solid-state image sensor as set forth in claim 1 wherein
   said n-type semiconductor layer is made of at least one member selected from the group consisting of ZnO, ZnS, ZnSe, CdS and CdSe.

4. A solid-state image sensor as defined in claim 1, wherein the major component of said first electrode is a member selected from the group consisting of Mo, Ta and Ti.

5. A solid-state image sensor as defined in claim 1 wherein
   said second electrode consists of a material whose work function is in excess of 4.5 eV.

6. A solid-state image sensor as defined in claim 5 wherein
   said material for said second electrode is a compound containing at least one member selected from the group consisting of $SnO_2$, $In_2O_3$, Au and Pt.

7. A solid-state image sensor as defined in claim 5 wherein
   said second electrode is transparent electrode formed by a sputtering method.

8. A solid-state image sensor as set forth in claim 1, further comprising means for applying a voltage between said substrate and said second electrode.

9. A solid-state image sensor as set forth in claim 1, wherein said semiconductor substrate having said region of said first conductivity type is of p-type,
   said region of said second conductivity is of n-type, and
   said charge transfer element is a bucket brigade element or a charge coupled element.

10. A solid-state image sensor as set forth in claim 1 further characterized in that
    said semiconductor substrate having said region of said first conductivity is of p-type,
    said region of said second conductivity is of n-type, and said switching element comprises a two-dimensional X-Y matrix.

11. A solid-state image sensor having a p-type semiconductor substrate having a plurality of unit cells, each unit cell comprising at least one n-type impurity region which is in or on said p-type semiconductor substrate and forming a diode portion in conjunction therewith, a first insulating layer disposed over said p-type semiconductor substrate, a first gate electrode extending through said first insulating layer and partly overlying said n-type impurity region, a second insulating layer overlying said first gate electrode, and a first electrode overlying said at least one of said insulating layers and electrically connected to said n-type impurity region.

* * * * *

UNITED STATES PATENT AND TRADEMARK OFFICE
CERTIFICATE OF CORRECTION

PATENT NO. : 4,236,829

DATED : December 2, 1980

INVENTOR(S) : Takao Chikamura, et al

It is certified that error appears in the above—identified patent and that said Letters Patent is hereby corrected as shown below:

In the Title Page, with respect to Foreign Application Priority Data: insert:
--June 19, 1978   Japan------53-74445 --.

Column 1, line 12: "an" should be --a--.

Column 9, Table 1: Under the column entitled "Total Response", above the last noted "4500", the word "Electrode" should be moved to the next column entitled "Direction of Incident Light", the third line from the bottom of the column.

Column 12, line 52: "nust" should be --must--.

Signed and Sealed this

Twenty-first Day of July 1981

[SEAL]

Attest:

GERALD J. MOSSINGHOFF

Attesting Officer

Commissioner of Patents and Trademarks

UNITED STATES PATENT AND TRADEMARK OFFICE
CERTIFICATE OF CORRECTION

PATENT NO. : 4,236,829

DATED : December 2, 1980

INVENTOR(S) : Takao Chikamura, et al

It is certified that error appears in the above—identified patent and that said Letters Patent is hereby corrected as shown below:

IN THE ABSTRACT:

line 4 : change "hole blocking" to --n-type semiconductor--

IN THE SPECIFICATION:

In each of Column 1, lines 49-50;

Column 9, Table 1; and

Column 9, line 30: change "new vicon" to --NEWVICON--

Column 1, line 65: change "ZnSE" to --ZnSe--

In each of Column 3, lines 43 and 45;

Column 4, line 54;

Column 6, lines 5 and 8;

UNITED STATES PATENT AND TRADEMARK OFFICE
CERTIFICATE OF CORRECTION

PATENT NO. : 4,236,829

DATED : December 2, 1980

INVENTOR(S) : Takao Chikamura, et al.

It is certified that error appears in the above—identified patent and that said Letters Patent is hereby corrected as shown below:

Column 7, line 34;

Column 9, lines 53, 56, 59, 61, 62, 64 and 67;

Column 10, lines 1, 4, 7 and 15: change "hole blocking" to --n-type semiconductor--

In each of Columns 4, lines 61-62 and

Column 6, line 32: change "hole stopper" to --n-type semiconductor--

In Column 13, line 34: change "$0 < y < 0.3$" to --$0 < y \leq 0.3$--

IN THE DRAWINGS:

Sheet 5, Figure 7B, should appear as shown on the attached sheet.

UNITED STATES PATENT AND TRADEMARK OFFICE
CERTIFICATE OF CORRECTION

PATENT NO. : 4,236,829

DATED : December 2, 1980

INVENTOR(S) : Takao Chikamura et al.

It is certified that error appears in the above—identified patent and that said Letters Patent is hereby corrected as shown below:

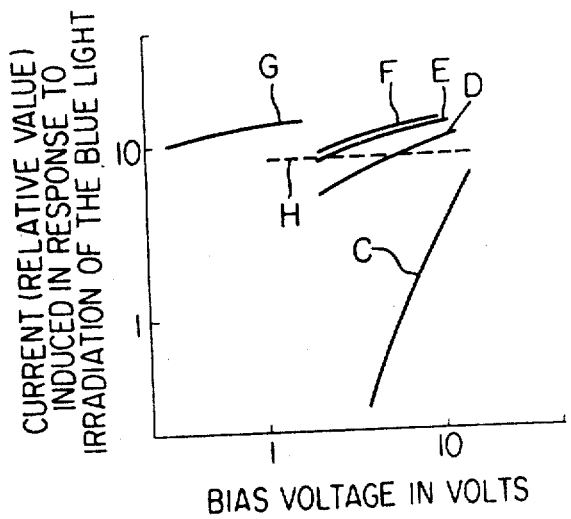

FIG. 7B

Signed and Sealed this

Second Day of February 1982

[SEAL]

Attest:

GERALD J. MOSSINGHOFF

Attesting Officer  Commissioner of Patents and Trademarks